United States Patent [19]
Tsunemine

[11] Patent Number: 6,144,053
[45] Date of Patent: Nov. 7, 2000

[54] SEMICONDUCTOR DEVICE HAVING A CAPACITOR WITH A HIGH DIELECTRIC CONSTANT FILM

[75] Inventor: Yoshikazu Tsunemine, Tokyo, Japan

[73] Assignee: Mitsubishi Denki Kabushiki Kaisha, Tokyo, Japan

[21] Appl. No.: 09/327,422

[22] Filed: Jun. 8, 1999

[30] Foreign Application Priority Data

Jan. 20, 1999  [JP]  Japan .................................. 11-011499

[51] Int. Cl.⁷ ................................................. H07L 27/108
[52] U.S. Cl. ........................................... 257/295; 257/306
[58] Field of Search .................................. 257/295, 296, 257/306

[56] References Cited

U.S. PATENT DOCUMENTS

| | | | |
|---|---|---|---|
| 5,418,388 | 5/1995 | Okudaira et al. | 257/295 |
| 5,717,236 | 2/1998 | Shinkawata | 257/306 |
| 5,796,136 | 8/1998 | Shinkawata | 257/306 |
| 5,798,903 | 8/1998 | Dhote et al. | 257/295 |
| 5,828,129 | 10/1998 | Roh | 257/751 |
| 5,838,035 | 11/1998 | Ramesh | 257/751 |

FOREIGN PATENT DOCUMENTS

9-232542  9/1997  Japan .

*Primary Examiner*—David Hardy
*Attorney, Agent, or Firm*—McDermott, Will & Emery

[57] ABSTRACT

A semiconductor device having a capacitor comprising an insulating layer 2 formed on a semiconductor substrate 1, a contact hole 9 disposed at a predetermined position on the insulating layer 2, a lower electrode 8 extending to the insulating layer 2 and electrically connected to the semiconductor substrate 1 through the contact hole, a dielectric film 10 formed to cover a surface of the lower electrode 8, an upper electrode 11 disposed on the dielectric film 10 so as to be opposite to the surface of the lower electrode 8 interposing the dielectric film, and a protection film 12 disposed adjacent to an end of a side surface of the lower electrode 8 for preventing the insulating layer 7 from being in contact with the dielectric film 10 at around the end, wherein the protection film is made of a material having a lattice constant same as or similar to that of the dielectric film 10, whereby it is possible to prevent deterioration of crystallization of the dielectric film to prevent a leak current in the capacitor from generating.

14 Claims, 7 Drawing Sheets

SEMICONDUCTOR DEVICE HAVING A CAPACITOR WITH A HIGH DIELECTRIC CONSTANT FILM

BACKGROUND OF THE INVENTION

1. Field of the Invention

The present invention relates to a semiconductor device having a capacitor, in particular, of which dielectric film is made of a material having a high dielectric constant.

2. Discussion of Background

A dynamic random access memory (DRAM) having memory cells, respectively composed of a metal oxide semiconductor (MOS) transistor and a capacitor, has been subjected to integration by microminiaturizing its elements because a structure of the memory cell is simple. Although the elements have been microminiaturized in accordance with such integration of the memory cell, it is necessary to retain a capacitance of the capacitor a predetermined value or more in consideration of operation of the elements.

For this, a capacitor structure, in which opposing areas of electrodes are increased by making a capacitor a three dimensional shape and a capacitance of capacitor is increased, such as a stacked capacitor having opposing electrodes of three dimensional shape by forming the capacitor in an inter-layer insulating film formed on a semiconductor substrate and a trench-type capacitor having opposing electrodes of three dimensional shape by forming a trench in a semiconductor substrate and a capacitor in this trench, is recently utilized against a conventional planer capacitor structure, in which opposing electrodes of a capacitor has a plane shape.

However, it becomes difficult to assure a predetermined capacitance of capacitor even though the three dimensional capacitor structure is used in response to trend of high integration, for example, a stage of DRAM of 256 Mbit.

Therefore, a structure with a dielectric film provided between opposing electrodes in place of an insulating film employed in a conventional capacitor structure is recently paid attention. According to this structure, not only a capacitance of capacitor obtained by increasing the areas of the opposing electrodes is made large, but also a dielectric constant of the capacitor is increased by the above location of the dielectric film, whereby the capacitance of capacitor is resultantly increased.

Figure 11:
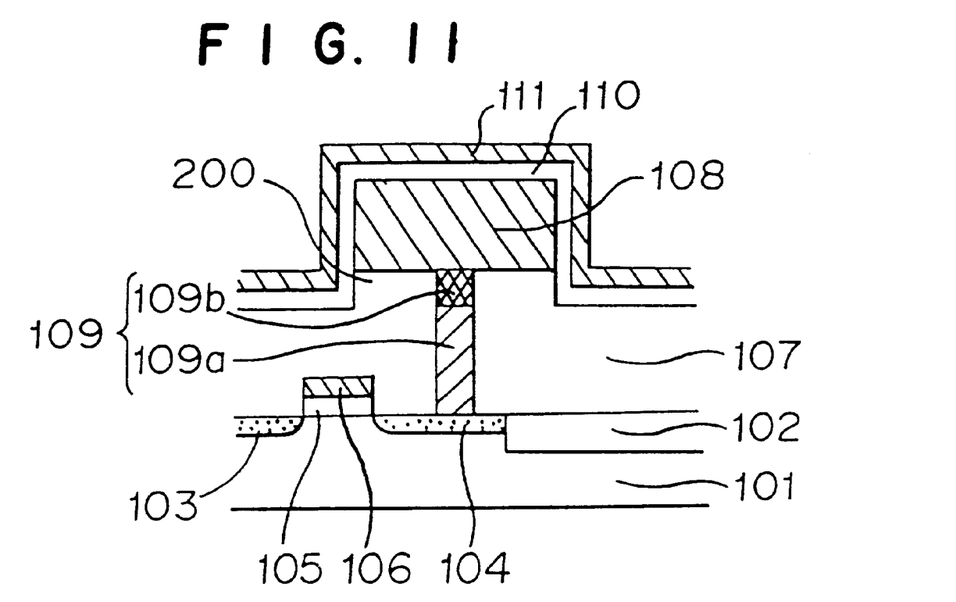
FIG. 11 schematically shows a conventional semiconductor device in section.

FIG. 11 is a schematic view for illustrating an example of a DRAM memory cell having a structure that a dielectric film is provided between opposing electrodes of a capacitor. As illustrated, in a semiconductor substrate 101, an element isolating layer 102, and source/drain areas 103 and 104 are formed. Further, a gate oxide film 105 is formed on the semiconductor substrate 101 at a position between the source/drain areas 103 and 104; and a gate electrode 106 is formed on the gate oxide film 105, whereby MOSFET is fabricated.

In the semiconductor substrate having this MOSFET, an inter-layer insulating film 107 is formed; and a lower electrode 108, one of the opposing electrodes of the capacitor, is formed on the inter-layer insulating film 107. A contact hole 109, in which doped polysilicon 109a and a barrier metal 109b are embedded, is provided in the inter-layer insulating film 107 so as to electrically connect the lower electrode 108 to the source/drain area 104.

A dielectric film 110 made of barium strontium titanate (hereinbelow referred to as BST) or the like is formed on the lower electrode 108 as if covering the electrode, and an upper electrode 111, the other electrode of the opposing electrodes, is formed so as to be opposite to the lower electrode 108 through the dielectric film 110. Another insulating film is further formed on the capacitor.

JP-A-9-232542 discloses a DRAM memory cell, in which an underlying insulating film made of silicon oxide or the like is formed just below the lower electrode for preventing the insulating film under the lower electrode from being removed at a time of forming the lower electrode.

Hereinbelow, a portion, at which the dielectric film 110 is in contact with the inter-layer insulating film 107 and the lower electrode 108, is designated by 200.

In the conventional semiconductor device, as illustrated in FIG. 11, the dielectric film is directly in contact with the inter-layer insulating film made of silicon oxide or the like in the vicinity of the portion 200.

Because the dielectric film does not have a high dielectric constant in an amorphous phase and has the high dielectric constant after changed to a crystalline state by crystal growth of the film, the dielectric film is formed to be changed to the crystalline state at the time of forming the film or later. On the contrary, the inter-layer insulating film is normally made of a silicon oxide film in an amorphous phase.

Therefore, the dielectric film is in contact with the inter-layer insulating film having a crystal structure largely different from that of the dielectric film, at around the portion 200 illustrated in FIG. 11, whereby the dielectric film to be formed on the inter-layer insulating film is insufficiently crystallized. Thus, there was a problem that a capability for holding an electric charge of the capacitor was deteriorated by a leak current caused by insufficient crystallization in a portion of the dielectric film positioned at an end of the capacitor.

SUMMARY OF THE INVENTION

It is an object of the present invention to solve the above-mentioned problems inherent in the conventional technique and to provide a semiconductor device, in which deterioration of crystallization in the dielectric film is not caused and a leak current in the capacitor is prevented from generating by providing a protection film for preventing the dielectric film from being in contact with the inter-layer insulating film at around the portion 200 illustrated in FIG. 11.

According to a first aspect of the present invention, there is provided a semiconductor device having a capacitor comprising an insulating layer formed on a semiconductor substrate, a contact hole disposed at a predetermined position on the insulating layer, a first conductor electrically connected to the semiconductor substrate through the contact hole and extending on the insulating layer, a dielectric film having a predetermined crystalline lattice constant formed to cover at least a surface of the first conductor, a second conductor disposed to be opposite to a surface of the first conductor through the dielectric film, and a protection film for preventing the insulating film from being in contact with the dielectric film at around an end of a side surface of the first conductor, disposed adjacent to at least the end of the side surface of the first conductor, wherein the protection film is made of a material having a crystalline lattice constant same as or similar to that of the dielectric film.

According to a second aspect of the present invention, there is provided a semiconductor device comprising an MOS transistor element having source/drain areas disposed on a semiconductor substrate, an insulating layer disposed to cover the semiconductor substrate and the MOS transistor element, a contact hole disposed at a predetermined position on the insulating layer, a first conductor extending on the insulating layer and electrically connected to the source or drain areas of the MOS transistor element through the contact hole, a dielectric film having a predetermined crystalline lattice constant formed to cover at least a surface of the first conductor, a second conductor disposed to be opposite to the surface of the first conductor through the dielectric film, and a protection film disposed in adjacent to at least a lower end of a side surface of the first conductor for preventing the insulating the film from being in contact with the dielectric film at around the lower end of the side surface, wherein the protection film is made of a material having a crystalline lattice constant same as or similar to that of the dielectric film.

According to a third aspect of the present invention, the protection film of the semiconductor device may be interposed between the first conductor and the insulating layer.

According to a fourth aspect of the present invention, the dielectric film of the semiconductor device is made of titanate including strontium titanate, barium titanate, and barium strontium titanate, perovskite compound oxide including zinc titanate zirconate and bismuth tantalate, barium-magnesium fluoride, and so on.

According to a fifth aspect of the present invention, the dielectric film of the semiconductor device is preferably made of titanate including strontium titanate, barium titanate, and barium strontium titanate having a lattice constant of 3.87 through 4.03 Å, in a case that a lower electrode is made of generally used platinum.

According to a sixth aspect of the present invention, the dielectric film of the semiconductor device is preferably made of barium strontium titanate because of its high relative dielectric constant and stability of composition.

According to a seventh aspect of the present invention, the protection film of the semiconductor device is preferably made of a material same as the dielectric film so as to have a crystalline lattice constant same as that of the dielectric film.

According to an eighth aspect of the present invention, the protection film of the semiconductor device preferably has substantially the same crystalline lattice constant as that of the dielectric film with an admissible error between the lattice constants within about 2%.

According to a ninth aspect of the present invention, the protection film of the semiconductor device is preferably made of titanate including strontium titanate, barium titanate, and barium strontium titanate having a lattice constant of 3.87 through 4.03 Å.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

EMBODIMENT 1

Figure 1:
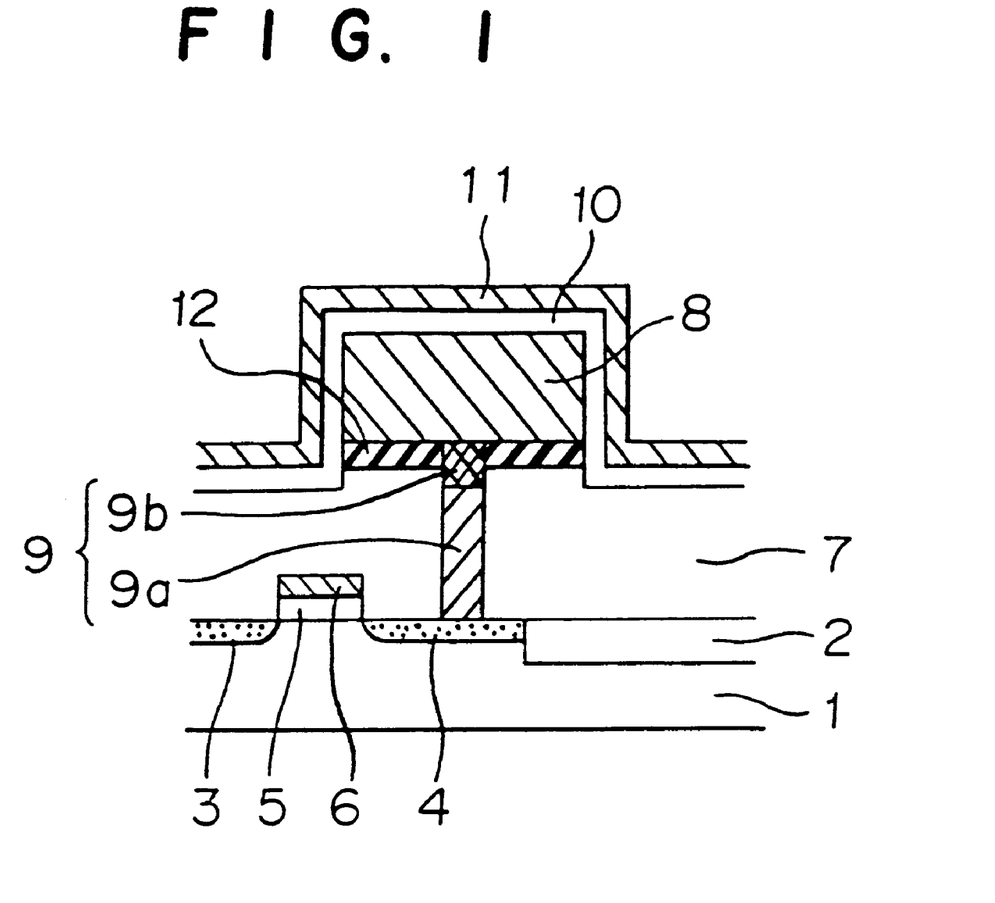
FIG. 1 schematically shows a semiconductor device according to Embodiment 1 of the present invention in section.

FIG. 1 is a cross-sectional view for showing a structure of a DRAM memory cell, namely a semiconductor device according to Embodiment 1. As shown, an element isolating layer 2, source/drain areas 3 and 4 are formed on a semiconductor substrate, and a gate oxide film 5 is formed between the source/drain areas 3 and 4 on the semiconductor substrate 1. A gate electrode 6 is formed on the gate oxide film 5. The MOSFET is fabricated by the source/drain areas 2 and 3, the gate oxide film 5, and the gate electrode 6.

On the semiconductor substrate formed with this MOSFET, an inter-layer insulating film 7 made of silicon oxide or the like is formed, and a protection film 12 having a crystalline structure similar to that of a dielectric film 10 composing a capacitor is formed on the inter-layer insulating film 7.

The protection film 12 may have a crystalline structure the same as or substantially the same as that of the dielectric film 10 to be described below. Specifically, an error between lattice constants representing crystalline structures of the dielectric film 10 and the protection film 12 is about 2% or less, more specifically, an error between lattice constants on surfaces of the dielectric film 10 and the protection film is about 2% or less. As for a crystalline structure, the dielectric film 10 is a cubic crystal or a tetragonal crystal; and the protection film 12 is a hexagonal crystal, wherein a ratio of lengths of the axis a is 1.38 through 1.44.

A material of the protection film 12 is a dielectric film made of barium strontium titanate (BST), zinc titanate zirconate, a dielectric film of fluoride system, or the like. The film thickness of the protection film 12 is 30 through 100 nm, preferably, 30 through 40 nm.

A lower electrode 8 made of platinum or the like, which is one of opposing electrodes of the capacitor, is formed on the protection film 12. Although the thickness of the lower electrode 8 is changed depending on a material to be used, 200 nm is employed in Embodiment 1. A contact hole 9, in which doped polycrystalline silicon 9a and barrier metal 9b are embedded, is formed in the inter-layer insulating film 7 so as to electrically connect the lower electrode 8 to the source/drain area 4.

The dielectric film 10 is formed on the lower electrode 8 and the protection film 12 to cover the lower electrode 8 and the protection film 12. The dielectric film 10 has a high dielectric in a crystalline phase, for which barium strontium titanate (BST), zinc titanate zirconate, fluoride system, and so on are suitable. Particularly, BST is preferable because it is excellent in terms of a high relative dielectric constant and stability of composition. Although the thickness of the dielectric film is changed depending on a material to be used, that of BST is ordinarily 30 through 100 nm.

An upper electrode 11, which is the other electrode of the opposing electrodes of the capacitor, is formed so as to be opposite to the lower electrode 8 through the dielectric film 10. Further, an insulating film is disposed on the capacitor.

In the next, a method of manufacturing the semiconductor device shown in FIG. 1 will be described.

FIGS. 2a through 3c illustrate steps of the method of manufacturing the semiconductor device shown in FIG. 1 for explanation.

Figure 2A:
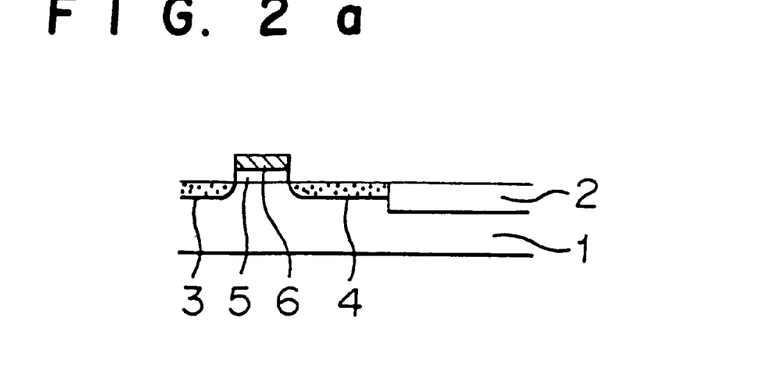
FIG. 2a illustrates a step of a method of manufacturing the semiconductor device shown in FIG. 1.

As illustrated in FIG. 2a, the element isolating layer 2 is formed on the semiconductor substrate 1. Thereafter, the gate oxide film 5 is formed on the semiconductor substrate 1, and succeedingly the gate electrode 6 is formed on the gate oxide film 5. Further, by forming the source/drain areas 3 and 4 by implanting impurities into the source/drain areas on the semiconductor substrate 1, the MOSFET is fabricated.

Figure 2B:
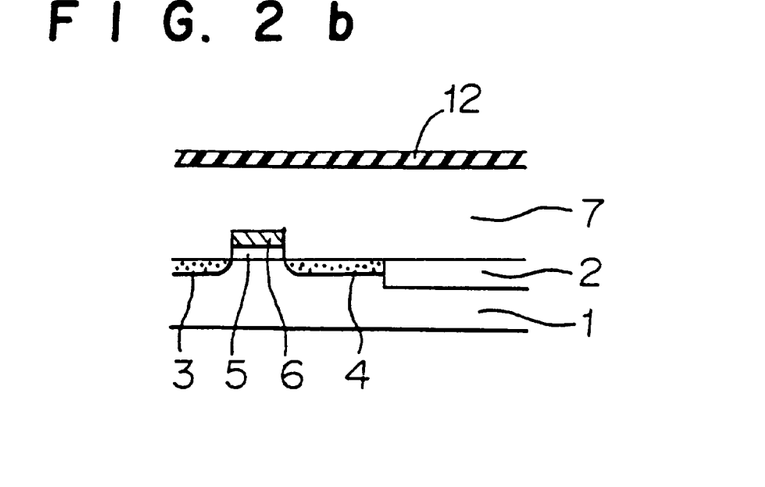
FIG. 2b illustrates a step of the method of manufacturing the semiconductor device shown in FIG. 1.

After fabricating the MOSFET, as illustrated in FIG. 2b, the inter-layer insulating film 7 made of silicon oxide or the like is formed on the semiconductor substrate including the MOSFET, and the protection film 12 made of the same material as that of the dielectric film, for example a BST film, is formed on the inter-layer insulating film 7. The thickness of the protection film 12 is generally 30 through 100 nm, preferably 30 through 40 nm.

Figure 2C:
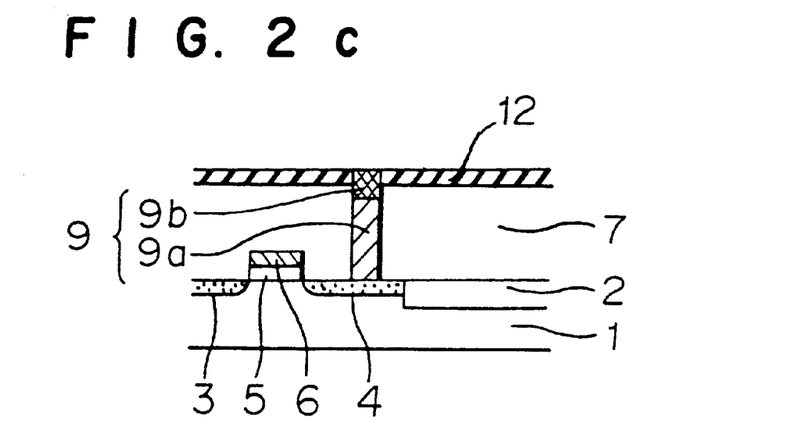
FIG. 2c illustrates a step of the method of manufacturing the semiconductor device shown in FIG. 1.
Figure 3:
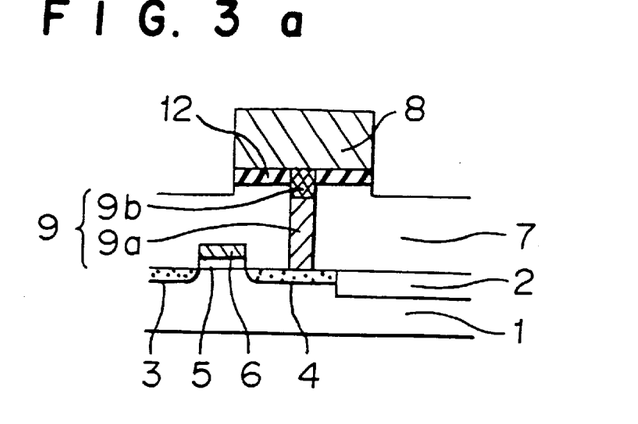
FIG. 3a illustrates a step of the method of manufacturing the semiconductor device shown in FIG. 1.
FIG. 3b illustrates a step of the method of manufacturing the semiconductor device shown in FIG. 1.
FIG. 3c illustrates a step of the method of manufacturing the semiconductor device shown in FIG. 1.

After forming the protection film, as illustrated in FIG. 2c, the contact hole 9 reachable to the source/drain area 4 is formed in the inter-layer insulating film 7 above the source/drain area 4 by photoengraving and etching; doped polycrystalline silicon 9a is embedded in the contact hole 9; and barrier metal 9b is embedded therein.

As illustrated in FIG. 3a, a conductive film is formed on the semiconductor substrate to have a thickness of, for example, 200 nm, and thereafter a portion corresponding to the lower electrode of the conductive film is covered by a mask and subjected to etching to remove portions of the conductive film and the protection film 12 except for portions of the conductive film and the protection film 12 under the mask, whereby the lower electrode 8 is formed.

In this etching, a surface layer of the inter-layer insulating film 7 is also removed.

After forming the lower electrode 8, as illustrated in FIG. 3b, the dielectric film 10 made of BST or the like is formed on the semiconductor substrate to have a thickness of, for example, 50 nm. At the time of forming the dielectric film 10, the dielectric film 10 is formed under a predetermined temperature so that it becomes in a crystalline state. The predetermined temperature may be in a range of 400 through 700° C. The predetermined temperature is sufficient to be able to crystallize the dielectric film. Although the thickness of the dielectric film is changed depending on its usage, it is generally 30 through 100 nm. In Embodiment 1, the thickness of the dielectric film is 50 nm.

Because the dielectric film 10 made of BST or the like has a high dielectric after transformed into a crystalline state, when the film is formed under an ordinary temperature, it is an amorphous phase and does not have a high dielectric. However, by forming the film under the temperature enabling crystallization as described, the dielectric film in a crystalline phase, i.e. the dielectric film having a high dielectric, can be formed.

Further, at the time of forming the dielectric film 10, the protection film 12 is formed under the dielectric film 10. Therefore, the dielectric film 10 is formed above the insulating layer through the protection film 12 on the lower electrode. In other words, because the dielectric film is not in contact with the inter-layer insulating film 7 by existence of the protection film 12 at around an end portion of the opposing electrodes of the capacitor, crystallization of the end portion is not deteriorated, and generation of leak current caused by insufficient crystallization can be prevented.

As illustrated in FIG. 3c, a conductive film made of platinum or the like, to serve as the upper electrode 11, is formed on the dielectric film 10 after forming the dielectric film 10. As described, the capacitor composed of the lower electrode 8, the dielectric film 10, and the upper electrode 11 is fabricated.

The dielectric film of the semiconductor device is made of titanate including strontium titanate, barium titanate, and barium strontium titanate, perovskite compound oxide including zinc titanate zirconate and bismuth tantalate, barium-magnesium fluoride, and so on.

The dielectric film of the semiconductor device is preferably made of barium strontium titanate because of its high relative dielectric constant and stability of composition.

In a case that a lower electrode is made of generally used platinum, the dielectric film of the semiconductor device is preferably made of titanate including strontium titanate, barium titanate, and barium strontium titanate having a lattice constant of 3.87 through 4.03 Å.

The protection film of the semiconductor device is preferably made of a material same as the dielectric film so as to have a crystalline lattice constant same as that of the dielectric film.

The protection film of the semiconductor device preferably has substantially the same crystalline lattice constant as that of the dielectric film with an admissible error between the lattice constants within about 2%.

The protection film of the semiconductor device is preferably made of titanate including strontium titanate, barium titanate, and barium strontium titanate having a lattice constant of 3.87 through 4.03 Å.

Because, in Embodiment 1, the protection film the same as the dielectric film is provided at the end portion of the capacitor to prevent the dielectric film from being in contact with the inter-layer insulating film, crystallization of the dielectric film at the end portion is not deteriorated, and it becomes possible to prevent a leak current caused by insufficient crystallization at the end portion from generating.

EMBODIMENT 2

Although, in Embodiment 1, the protection film is made of the same material as the dielectric film, a protection film is made of a material other than that of a dielectric film in Embodiment 2. Because other features are the same as those in Embodiment 1, repeating explanation is omitted.

In order not to obstruct crystallization of the dielectric film, the protection film has substantially the same crystal structure as the dielectric film at a contact portion between the protection film and the dielectric film. Although the dielectric film made of BST has the crystal structure composed of three elements of barium, strontium, and titanium, a cut edge of the BST crystal is not always composed of these three elements depending on where the crystal is cut, and there is a case that the cut edge is composed of at least two elements among these three elements depending on the cut edge. Accordingly, the protection film to be formed in order not to obstruct the crystallization of the dielectric film is unnecessarily made of the elements composing the dielectric film. For example, when the dielectric film is made of zinc titanium zirconium, because magnesium oxide is a cubic crystal same as zinc titanium zirconium and has a lattice constant substantially a half thereof, oxygen atoms appear in a common cycle between zinc titanium zirconium and magnesium oxide, whereby an effect of promoting the crystallization is prospected.

In Embodiment 2, because the protection film having a lattice constant substantially a half of that of the dielectric film and being a cubic crystal as in the dielectric film to prevent the dielectric film from being in contact with an inter-layer insulating film at an end portion of a capacitor, and also lattices of the dielectric film and the protection film can be properly arranged, the dielectric film is easily crystallized at the end portion of the capacitor; and it becomes possible to prevent generation of leak current at the end portion caused by insufficient crystallization.

EMBODIMENT 3

Figure 4:
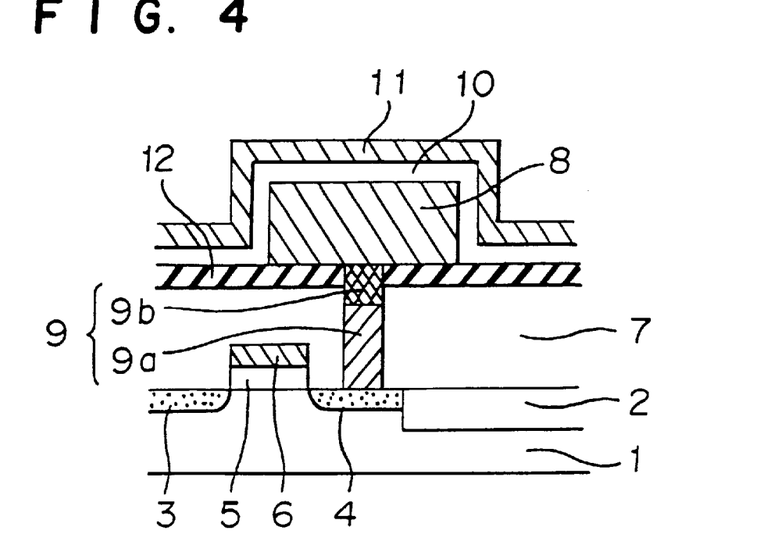
FIG. 4 schematically shows a semiconductor device according to Embodiment 3 of the present invention in section.
Figure 5:
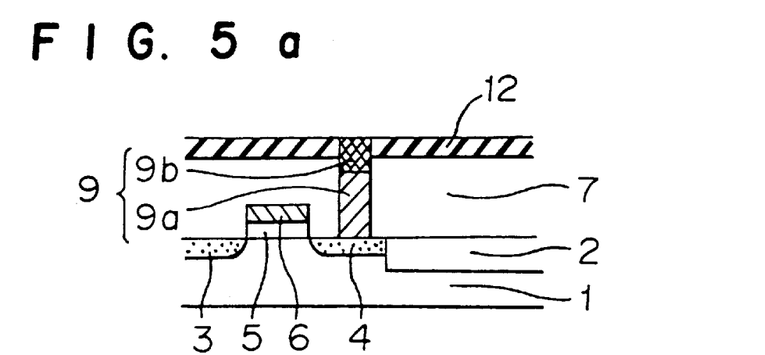
FIG. 5a illustrates a step of a method of manufacturing the semiconductor device shown in FIG. 4.
FIG. 5b illustrates a step of the method of manufacturing the semiconductor device shown in FIG. 4.

FIG. 4 is a cross-sectional view for showing a structure of DRAM memory cell as a semiconductor device according to Embodiment 3 of the present invention. As shown, a protection film 12 is formed on an inter-layer insulating film 7 on a semiconductor substrate 1, and a lower electrode 8 of a capacitor is formed on the protection film 12. The lower electrode 8 is formed in an inside of an area formed with the protection film. In other words, the protection film 12 is formed to cover a lower area of the lower electrode 8. Because the other features are the same as those in Embodiment 1, repeating explanation is omitted.

In the next, a method of manufacturing the semiconductor device shown in FIG. 4 will be described. FIGS. 5a through 6b illustrate steps of the method of manufacturing the semiconductor device shown in FIG. 4 for explanation.

As illustrated in FIG. 5a, an MOSFET is formed on the semiconductor substrate in a similar manner to that in FIG. 2 of Embodiment 1; the inter-layer insulating film 7 is formed thereon; the protection film 12 is formed on the inter-layer insulating film 7; and a contact hole 9 is formed.

The lower electrode 8 is formed such that a conductive film having a predetermined thickness is formed on the semiconductor substrate; a portion of the conductive film on the lower electrode is covered by a mask; and the conductive film is etched to leave a portion of the conductive film under the mask and remove the other portion of the conductive film. In etching, the protection film 12 is used as an etching stopper and the protection film 12 on the inter-layer insulating film 7 is left.

Figure 6A:
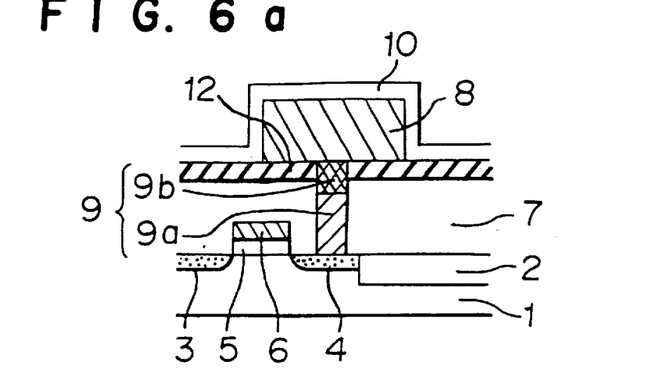
FIG. 6a illustrates a step of the method of manufacturing the semiconductor device shown in FIG. 4.

After forming the lower electrode as illustrated in FIG. 6a, the dielectric film 10 made of BST or the like is formed to have a thickness of, for example, 50 nm on the semiconductor substrate. The dielectric film 10 is formed under a predetermined temperature to be a crystalline phase. The predetermined temperature may be in a range of 400 through 500° C. The temperature is sufficient to be able to crystallize the dielectric film. The thickness of the dielectric film is generally 30 through 100 nm, preferably 50 nm.

Figure 6B:
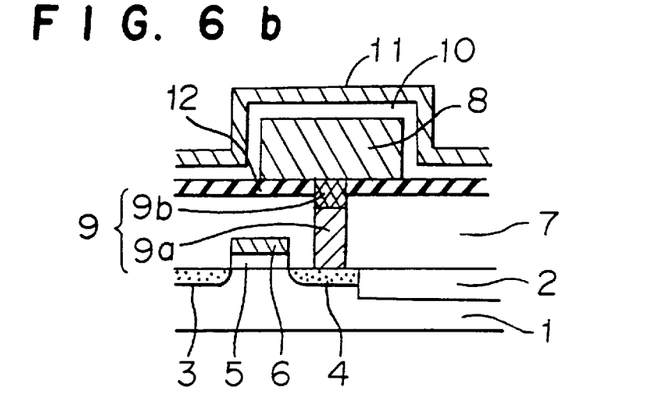
FIG. 6b illustrates a step of the method of manufacturing the semiconductor device shown in FIG. 4.

After forming the dielectric film 10 as illustrated in FIG. 6b, an upper electrode 11 is formed by forming a conductive film of platinum or the like on the dielectric film 10. As described, the capacitor composed of the lower electrode 8, the dielectric film 10, and the upper electrode 11 is fabricated.

In Embodiment 3, since the protection film made of a material substantially the same as that of the dielectric film to prevent the dielectric film from being in contact with the inter-layer insulating film at an end portion of the capacitor, the dielectric film is easily crystallized at the end portion of the capacitor, and it becomes possible to prevent generation of leak current caused by insufficient crystallization at the end portion. Further, it becomes possible to make thin the inter-layer insulating film under the capacitor using the protection film as an etching stopper to reduce the amount of overetching. As a result, the depth of a plug hole can be diminished.

EMBODIMENT 4

Figure 7:
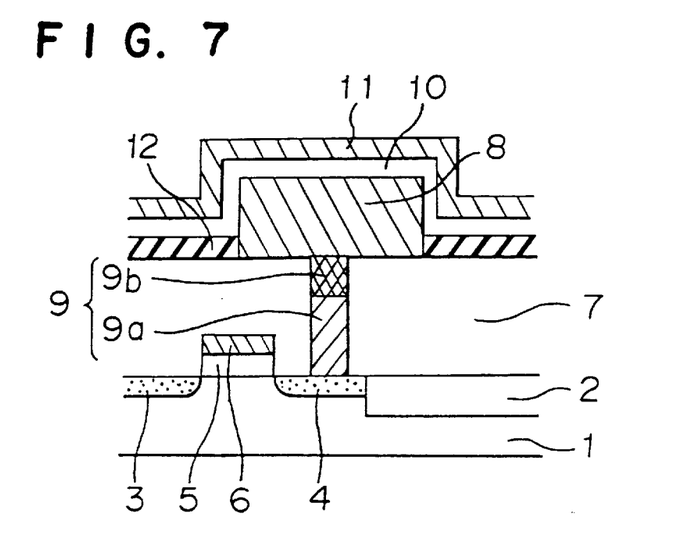
FIG. 7 schematically shows a semiconductor device according to Embodiment 4 of the present invention in section.

FIG. 7 is a cross-sectional view for showing a structure of a DRAM memory cell as a semiconductor device according to Embodiment 4 of the present invention. In comparison with the semiconductor device shown in FIG. 4 of Embodiment 3, in which the protection film 12 is formed on the inter-layer insulating film 7 other than an area of the contact hole 9, a protection film 12 is formed to be in contact with a side portion of a lower electrode 8 on a portion of the inter-layer insulating film 7 not below the lower electrode 8 in FIG. 7 of this Embodiment 4. As shown, the protection film 12 is formed on the portion of inter-layer insulating film 7 not below the lower electrode 8. Since the other features are similar to those in FIG. 4, repeating explanation is omitted.

As for a method of manufacturing the semiconductor device shown in FIG. 7, after forming the protection film 12 on the inter-layer insulating film 7, a portion other than receiving the lower electrode on the protection film 12 is covered by a mask; the protection film is etched to remove the portion other than the protection film 12 corresponding to the lower electrode. Since the other features are similar to those in the method of manufacturing the semiconductor device according to Embodiment 3, repeating explanation is omitted.

Figure 8:
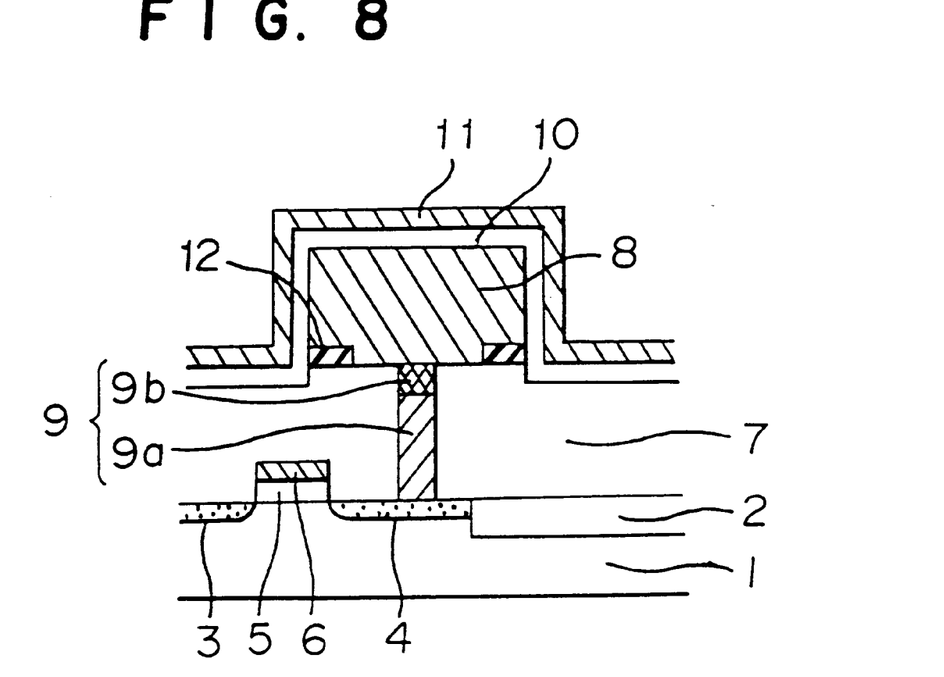
FIG. 8 schematically shows another semiconductor device according to Embodiment 4 of the present invention in section.

FIG. 8 is a cross-sectional view for showing other semiconductor device according to this Embodiment 4. It becomes possible to obtain a similar effect to that in the semiconductor device shown in FIG. 1 even though the protection film is formed only at an end portion in contact with the dielectric film in the semiconductor device shown in FIG. 1.

Figure 9:
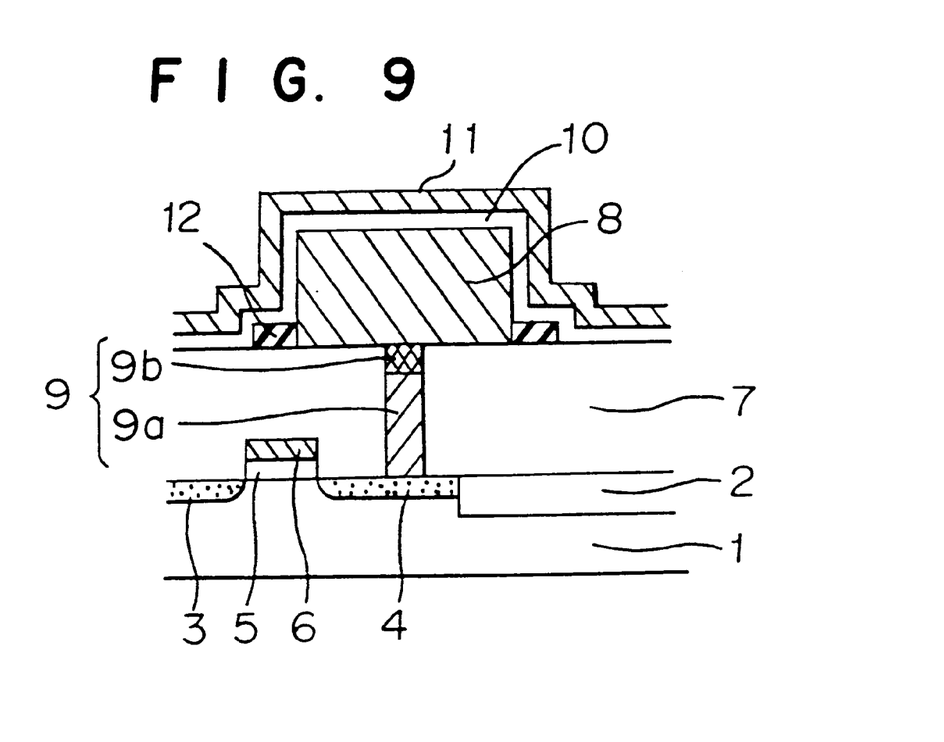
FIG. 9 schematically shows another semiconductor device according to Embodiment 4 of the present invention in section.

FIG. 9 is a cross-sectional view for showing other semiconductor device according to this Embodiment 4. It is possible to obtain a similar effect to that in the semiconductor device shown in FIG. 7 even though the protection film is formed only at the end portion in contact with the dielectric film in the semiconductor device shown in FIG. 7.

EMBODIMENT 5

Figure 10:
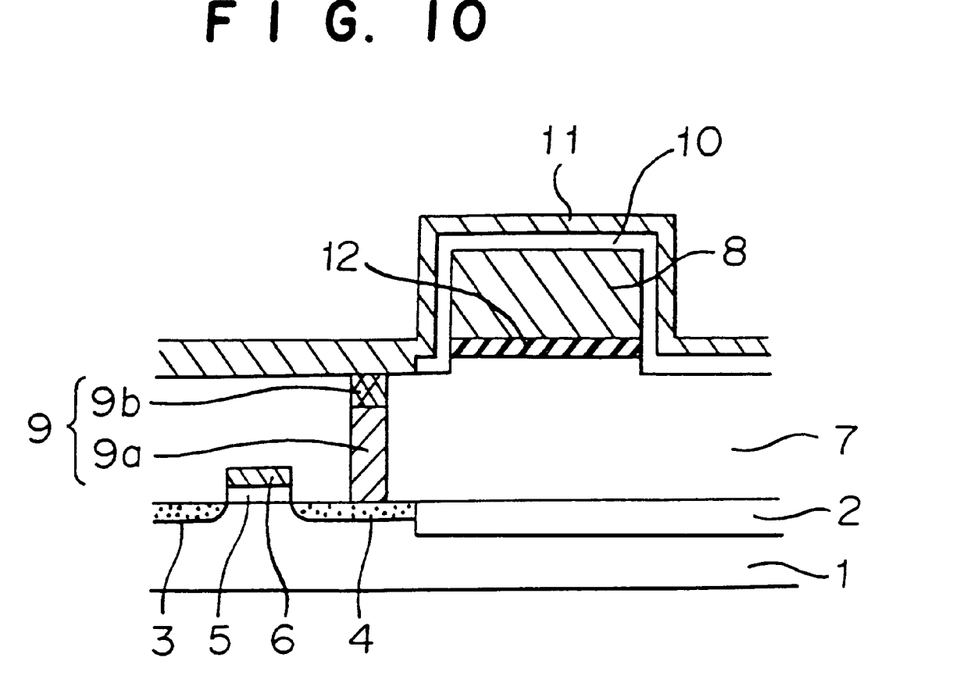
FIG. 10 schematically shows a semiconductor device according to Embodiment 5 of the present invention in section.

FIG. 10 is a cross-sectional view for showing a structure of a DRAM memory cell as a semiconductor device according to Embodiment 5 of the present invention. In comparison with the semiconductor devices according to Embodiments 1 through 4, in which the lower electrodes are electrically in contact with the source/drain areas of MOSFET through the contact holes, an upper electrode is electrically in contact with a source/drain area of an MOSFET through a contact hole in the semiconductor device according to Embodiment 5.

As shown, a protection film 12 is formed on an inter-layer insulating film 7; and a lower electrode 8 is formed on the protection film 12. The lower electrode 8 is formed apart from an upper area of the source/drain area 4.

A dielectric film 10 covers the lower electrode 8 and extends from a side portion of the lower electrode 8 to an upper surface of the inter-layer insulating film 7 interposing the protection film 12. The upper electrode 11 is provided so as to be opposite to the lower electrode 8 interposing the dielectric film 10.

The upper electrode 11 further extends from an upper surface of the dielectric film to an upper surface of the inter-layer insulating film 7 and is formed to be electrically in contact with the source/drain area 4 through a contact hole 9 formed in the inter-layer insulating film 7 above the source/drain area 4. Since the other features are similar to those in Embodiment 1, repeating explanation is omitted.

Although, in Embodiment 5, the structure that the upper electrode is electrically connected to the source/drain area through the contact hole instead of the structure that the lower electrode of the semiconductor device described in Embodiment 1 is electrically connected to the source/drain area through the contact hole, a structure that the upper electrode is electrically connected to the source/drain area through the contact hole instead of the lower electrode also with respect to the semiconductor devices described in Embodiments 2 through 4 in a similar manner.

Although, in Embodiments 1 through 5, the electrode electrically connected to the source/drain area of MOSFET through the contact hole is composed of a single conductor, the present invention is not specifically limited to such a structure, and it is possible to make the electrode a multi-layer structure, for example, by making a lower layer of the electrode using barrier metal.

The invention provides an effect that crystallization of the dielectric film at the end portion of the capacitor is prevented from being deteriorated, and a leak current in the capacitor is prevented from generating.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device having a capacitor comprising:
   an insulating layer formed on a semiconductor substrate;
   a contact hole disposed at a predetermined position of said insulating layer;
   first conductor extending to said insulating layer and electrically connected to said semiconductor substrate through said contact hole;
   a dielectric film having a predetermined lattice constant formed to cover at least a surface of said first conductor;
   a second conductor formed on said dielectric film to be opposite to said surface of said first conductor interposing said dielectric film; and
   a protection film disposed in adjacent to at least an end of a side surface of said first conductor for preventing said insulating layer from being in contact with said dielectric film at around the end of the side surface; wherein:
   said protection film is made of a material having a lattice constant same as or similar to that of said dielectric film;
   said protection film is disposed to interpose between said first conductor and said insulating layer, and
   the first conductor or the second conductor is electrically connected to said semiconductor substrate through said contact hole.

2. The semiconductor device according to claim 1, wherein
   said dielectric film has a lattice constant of 3.87 through 4.03 Å.

3. The semiconductor device according to claim 2, wherein
   said dielectric film is made of at least one of barium strontium titanate (BST), zinc titanate zirconate, strontium titanate, barium titanate, bismuth tantalate, and barium magnesium.

4. The semiconductor device according to claim 1, wherein
   said protection film contains at least two constituents among constituents of said dielectric films.

5. A semiconductor device having a capacitor comprising:
   an insulating layer formed on a semiconductor substrate;
   a contact hole disposed at a predetermined position of said insulating layer;
   a first conductor extending to said insulating layer and electrically connected to said semiconductor substrate through said contact hole;
   a dielectric film having a predetermined lattice constant formed to cover at least a surface of said first conductor;
   a second conductor formed on said dielectric film to be opposite to said surface of said first conductor interposing said dielectric film; and
   a protection film disposed in adjacent to at least an end of a side surface of said first conductor for preventing said insulating layer from being in contact with said dielectric film at around the end of the side surface; wherein:
   said protection film is made of a material having a lattice constant same as or similar to that of said dielectric film; and
   said protection film has a lattice constant of 3.87 through 4.03 Å.

6. The semiconductor device according to claim 5, wherein
   said protection film is at least one of dielectric films made of barium strontium titanate (BST), zinc titanate zirconate, strontium titanate, barium titanate, bismuth tantalate, and barium magnesium.

7. A semiconductor device having a capacitor comprising:
   an insulating layer formed on a semiconductor substrate;

a contact hole disposed at a predetermined position of said insulating layer;

a first conductor extending to said insulating layer and electrically connected to said semiconductor substrate through said contact hole;

a dielectric film having a predetermined lattice constant formed to cover at least a surface of said first conductor;

a second conductor formed on said dielectric film to be opposite to said surface of said first conductor interposing said dielectric film; and a protection film disposed in adjacent to at least an end of a side surface of said first conductor for preventing said insulating layer from being in contact with said dielectric film at around the end of the side surface; wherein:

said protection film is made of a material having a lattice constant same as or similar to that of said dielectric film; and a ratio between the lattice constant of said protection film and the lattice constant of said dielectric film is substantially 1:2 or 2:1.

8. A semiconductor device comprising:

an MOS transistor disposed on a semiconductor substrate and having source/drain areas;

a memory cell having a capacitor;

an insulating layer disposed to cover said semiconductor substrate and said MOS transistor;

a contact hole disposed at a predetermined position on said insulating layer;

a first conductor extending to said insulating layer and electrically connected to one of said source/drain areas of said MOS transistor through said contact hole;

a dielectric film formed to cover at least a surface of said first conductor and having a predetermined lattice constant;

a second conductor disposed on said dielectric film so as to be opposite to the surface of said first conductor interposing said dielectric film; and a protection film disposed in adjacent to at least an end of a side surface of said first conductor for preventing said insulating layer from being in contact with said dielectric film at around the end of the side surface; wherein:

said protection film is made of a material having a lattice constant same as or similar to that of said dielectric film;

said protection film is disposed to interpose between said first conductor and said insulating layer, and the first conductor or the second conductor is electrically connected to one of said source/drain areas of said MOS transistor through said contact hole.

9. The semiconductor device according to claim 8, wherein said dielectric film has a lattice constant of 3.87 through 4.03 Å.

10. The semiconductor device according to claim 8, wherein said protection film contains at least two constituents among constituents of said dielectric films.

11. A semiconductor device comprising:

an MOS transistor disposed on a semiconductor substrate and having source/drain areas;

a memory cell having a capacitor;

an insulating layer disposed to cover said semiconductor substrate and said MOS transistor;

a contact hole disposed at a predetermined position on said insulating layer;

a first conductor extending to said insulating layer and electrically connected to one of said source/drain areas of said MOS transistor through said contact hole;

a dielectric film formed to cover at least a surface of said first conductor and having a predetermined lattice constant;

a second conductor disposed on said dielectric film so as to be opposite to the surface of said first conductor interposing said dielectric film; and a protection film disposed in adjacent to at least an end of a side surface of said first conductor for preventing said insulating layer from being in contact with said dielectric film at around the end of the side surface; wherein:

said protection film is made of a material having a lattice constant same as or similar to that of said dielectric film; and said dielectric film is made of at least one of barium strontium titanate (BST), zinc titanate zirconate, strontium titanate, barium titanate, bismuth tantalate, and barium magnesium.

12. A semiconductor device comprising:

an MOS transistor disposed on a semiconductor substrate and having source/drain areas;

a memory cell having a capacitor;

an insulating layer disposed to cover said semiconductor substrate and said MOS transistor;

a contact hole disposed at a predetermined position on said insulating layer;

a first conductor extending to said insulating layer and electrically connected to one of said source/drain areas of said MOS transistor through said contact hole;

a dielectric film formed to cover at least a surface of said first conductor and having a predetermined lattice constant;

a second conductor disposed on said dielectric film so as to be opposite to the surface of said first conductor interposing said dielectric film; and a protection film disposed in adjacent to at least an end of a side surface of said first conductor for preventing said insulating layer from being in contact with said dielectric film at around the end of the side surface; wherein:

said protection film is made of a material having a lattice constant same as or similar to that of said dielectric film; and said protection film has a lattice constant of 3.87 through 4.03 Å.

13. The semiconductor device according to claim 12, wherein said protection film is at least one of dielectric films made of barium strontium titanate (BST), zinc titanate zirconate, strontium titanate, barium titanate, bismuth tantalate, and barium magnesium.

14. A semiconductor device comprising:

an MOS transistor disposed on a semiconductor substrate and having source/drain areas;

a memory cell having a capacitor;

an insulating layer disposed to cover said semiconductor substrate and said MOS transistor;

a contact hole disposed at a predetermined position on said insulating layer;

a first conductor extending to said insulating layer and electrically connected to one of said source/drain areas of said MOS transistor through said contact hole;

a dielectric film formed to cover at least a surface of said first conductor and having a predetermined lattice constant;

a second conductor disposed on said dielectric film so as to be opposite to the surface of said first conductor interposing said dielectric film; and a protection film disposed in adjacent to at least an end of a side surface of said first conductor for preventing said insulating layer from being in contact with said dielectric film at around the end of the side surface; wherein:

said protection film is made of a material having a lattice constant same as or similar to that of said dielectric film; and a ratio between the lattice constant of said protection film and the lattice constant of said dielectric film is substantially 1:2 or 2:1.

* * * * *